US006984544B2

(12) United States Patent
Cloud et al.

(10) Patent No.: US 6,984,544 B2
(45) Date of Patent: Jan. 10, 2006

(54) DIE TO DIE CONNECTION METHOD AND ASSEMBLIES AND PACKAGES INCLUDING DICE SO CONNECTED

(75) Inventors: Eugene H. Cloud, Boise, ID (US); Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/944,487

(22) Filed: Aug. 30, 2001

(65) Prior Publication Data

US 2002/0006686 A1 Jan. 17, 2002

Related U.S. Application Data

(62) Division of application No. 09/615,009, filed on Jul. 12, 2000.

(51) Int. Cl.
 H01L 21/44 (2006.01)
 H01L 21/48 (2006.01)
 H01L 21/50 (2006.01)

(52) U.S. Cl. ..................................................... 438/107
(58) Field of Classification Search ................. 438/107, 438/108, 109, 110, 618, 666; 257/678, 723, 257/724, 777, 686, 735, 778, 779, 780
See application file for complete search history.

(56) References Cited

U.S. PATENT DOCUMENTS

| 3,777,221 A | 12/1973 | Tatusko et al. |
| 5,014,161 A | 5/1991 | Lee et al. |
| 5,291,061 A | 3/1994 | Ball |
| 5,302,778 A | * 4/1994 | Maurinus .................... 174/52.4 |
| 5,435,734 A | 7/1995 | Chow |
| RE35,119 E | 12/1995 | Blonder et al. |

(Continued)

FOREIGN PATENT DOCUMENTS

| JP | 04243173 A | 1/1991 |
| JP | 06151617 A | * 5/1994 |

OTHER PUBLICATIONS

Miller et al., "Maskless Mesoscale Materials Deposition Technology,", Sep. 2001, pages 20–22.
Miller, "New Laser Directed Deposition Technology", Microeletronic Fabrication, Aug. 2001, page 16.
Webpage, Object Prototyping the Future, "Object FullCure 700 Series", 2 pages.
Webpage, Objet Prototyping the Future, "How it Works", 2 pages.

*Primary Examiner*—Long Pham
*Assistant Examiner*—Dana Farahani
(74) *Attorney, Agent, or Firm*—TraskBritt

(57) ABSTRACT

An assembly includes a first semiconductor die with bond pads arranged in an array on an active surface thereof and at least one second semiconductor die with bond pads on an active surface thereof flip-chip connected to bond pads of the first semiconductor device. The at least one second semiconductor die is oriented with the active surface thereof facing the active surface of the first semiconductor die. Corresponding bond pads of the first and at least one second semiconductor dice are connected by placing or forming conductive structures therebetween. A package includes the assembly and a carrier. The first semiconductor die of the assembly is oriented over the carrier with the active surface of the first semiconductor die facing the carrier. Bond pads of the first semiconductor die located laterally beyond an outer periphery of each second semiconductor die are electrically connected to corresponding contacts by way of conductive structures.

42 Claims, 7 Drawing Sheets

U.S. PATENT DOCUMENTS

| | | | |
|---|---|---|---|
| 5,477,082 A * | 12/1995 | Buckley, III et al. ....... 257/679 |
| 5,477,086 A | 12/1995 | Rostoker et al. |
| 5,532,519 A | 7/1996 | Bertin et al. |
| 5,535,101 A | 7/1996 | Miles et al. |
| 5,558,271 A | 9/1996 | Rostoker et al. |
| 5,559,444 A | 9/1996 | Farnworth et al. |
| 5,561,328 A | 10/1996 | Massingill et al. |
| 5,719,436 A | 2/1998 | Kuhn |
| 5,767,580 A | 6/1998 | Rostoker |
| 5,773,320 A | 6/1998 | Bayerer |
| 5,777,345 A | 7/1998 | Loder et al. |
| 5,790,839 A | 8/1998 | Luk et al. |
| 5,793,101 A | 8/1998 | Kuhn |
| 5,883,814 A | 3/1999 | Luk et al. |
| 5,900,676 A | 5/1999 | Kweon et al. |
| 5,914,535 A | 6/1999 | Brandenburg |
| 5,973,924 A | 10/1999 | Gillespie, Jr. |
| 5,977,640 A | 11/1999 | Bertin et al. |
| RE36,613 E | 3/2000 | Ball |
| 6,064,120 A * | 5/2000 | Cobbley et al. ............ 257/780 |
| 6,100,593 A * | 8/2000 | Yu et al. ..................... 257/777 |
| 6,150,724 A | 11/2000 | Wenzel et al. |
| 6,222,246 B1 | 4/2001 | Mak et al. |
| 6,232,667 B1 * | 5/2001 | Hultmark et al. ............ 257/777 |
| 6,238,949 B1 | 5/2001 | Nguyen et al. |
| 6,239,366 B1 * | 5/2001 | Hsuan et al. ............... 174/52.3 |
| 6,251,488 B1 | 6/2001 | Miller et al. |
| 6,259,962 B1 | 7/2001 | Gothait |
| 6,268,584 B1 | 7/2001 | Keicher et al. |
| 6,310,403 B1 | 10/2001 | Zhang et al. |
| 6,317,333 B1 * | 11/2001 | Baba ......................... 361/795 |
| 6,376,915 B1 * | 4/2002 | Hikita et al. ................. 257/777 |
| 6,391,251 B1 | 5/2002 | Keicher et al. |
| 6,392,309 B1 | 5/2002 | Wataya et al. |
| 6,403,882 B1 * | 6/2002 | Chen et al. ................ 174/52.4 |
| 6,524,346 B1 | 2/2003 | Farnworth |
| 6,549,821 B1 | 4/2003 | Farnworth et al. |
| 2002/0171177 A1 | 11/2002 | Kritchman et al. |
| 2003/0102566 A1 | 6/2003 | Farnworth |
| 2003/0111727 A1 | 6/2003 | Kurusu |
| 2003/0151167 A1 | 8/2003 | Kritchman et al. |

* cited by examiner

DIE TO DIE CONNECTION METHOD AND ASSEMBLIES AND PACKAGES INCLUDING DICE SO CONNECTED

CROSS-REFERENCE TO RELATED APPLICATION

This application is a divisional of application Ser. No. 09/615,009, filed Jul. 12, 2000, now U.S. Pat. No. 6,525,413, issued Feb. 25, 2003.

BACKGROUND OF THE INVENTION

1. Field of the Invention

The present invention relates generally to multi-chip modules and, particularly, to multi-chip modules including a first semiconductor die with one or more other semiconductor dice connected directly thereto in a flip-chip fashion. The present invention also relates to methods for assembling these multi-chip modules. In addition, the present invention relates to semiconductor device packages including the inventive multi-chip modules and to methods for forming such packages.

2. State of the Art

Accompanying the trend toward manufacturing computers and other electronic devices of ever increasing speed and ever decreasing size is the need for semiconductor device components of ever increasing capabilities and, thus, having an increased number of features that consume the same or a lesser amount of space.

Multi-chip modules are one example of an approach that has been taken in the semiconductor device industry to increase the feature density of semiconductor devices. Known multi-chip modules typically include a plurality of semiconductor dice that may be electrically connected to one another indirectly by way of carrier substrates to which each of the dice are electrically connected.

U.S. Pat. No. 5,914,535 (hereinafter "the '535 Patent"), issued to Brandenburg on Jun. 22, 1999, discloses a multi-chip module including a daughter board with several semiconductor dice flip-chip bonded thereto. The daughter board includes contact pads located outside of a periphery of an area where the semiconductor dice are flip-chip bonded to facilitate flip-chip connection of the multi-chip module to a mother board with the dice of the multi-chip module being located between the daughter board and the mother board.

Another type of multi-chip module is disclosed in U.S. Pat. No. 5,719,436 (hereinafter "the '436 Patent") and U.S. Pat. No. 5,793,101 (hereinafter "the '101 Patent"), issued to Kuhn on Feb. 17, 1998 and Aug. 11, 1998, respectively. Both the '436 and '101 Patents disclose packaged multi-chip modules that include a plurality of semiconductor dice. Each package includes a substrate bearing conductive traces, to which each of the semiconductor dice are electrically connected. The semiconductor dice may be electrically connected to the substrate by way of wire bonding or flip-chip bonding. The substrate, which may comprise a flex circuit, wraps around and is supported by both surfaces of a die paddle. The conductive traces of the substrate are electrically connected to leads by bond wires. Bond pads of the semiconductor dice may also be directly electrically connected to the leads of the package.

U.S. Pat. No. RE. 36,613, issued to Ball on Mar. 14, 2000, discloses a multi-chip module including stacked semiconductor dice. While the dice are stacked one on top of another, they are not directly connected to one another, but rather to leads of a package including the multi-chip module.

Other types of multi-chip modules that include one or more semiconductor dice that are flip-chip bonded to a carrier are also known. None of these multi-chip modules, however, include semiconductor dice that are directly flip-chip bonded to one another with the subsequent assembly then being flip-chip mounted to a substrate.

Keeping in mind the trend toward faster computers and other electronic devices, the use of intermediate conductive elements, such as wire bonds, and the conductive traces of carrier substrates to electrically connect the semiconductor dice of a multi-chip module is somewhat undesirable since the electrical paths of these types of connections are typically lengthy and, consequently, limit the speed with which the semiconductor dice of the multi-chip module may communicate with one another. The affects that these types of connections in conventional multi-chip modules have on the speed at which an electronic device, such as a computer, operates are particularly undesirable when one of the semiconductor dice of the multi-chip module is a microprocessor and the other semiconductor dice of the multi-chip module are semiconductor devices with which the microprocessor should quickly communicate.

The so-called system-on-a-chip (SOC) has been developed to increase the speed with which two semiconductor devices, such as a logic device (e.g., a microprocessor) and a memory device, communicate. Each of the semiconductor devices of a SOC structure are fabricated on the same substrate, providing very short connections with reduced contact resistance between two or more devices. The speed with which the two devices communicate is, therefore, increased relative to the speeds with which the separate semiconductor devices of conventional assemblies communicate.

While system-on-a-chip technology provides much quicker communication between different semiconductor devices, the fabrication processes that are used to make different types of semiconductor devices, such as logic and memory devices, differ significantly. In fact, the best processes to fabricate similar structures on different types of semiconductor devices may be very different. Moreover, the organization and locations of structures on different types of semiconductor devices may also differ significantly. Thus, it is not only difficult to merge two or more processes to facilitate the simultaneous fabrication of two or more different types of semiconductor devices on the same substrate, such simultaneous fabrication also requires process compromises for one or more of the types of semiconductor devices being fabricated, which may increase fabrication costs and decrease the performance of one or more of the different types of simultaneously fabricated semiconductor devices.

Accordingly, there is a need for a multi-chip module with increased speed of communication between the semiconductor dice thereof, the semiconductor dice of which may be fabricated by existing processes.

SUMMARY OF THE INVENTION

The present invention includes an assembly of a first semiconductor die and at least one second semiconductor die. Each second semiconductor die of the assembly is flip-chip bonded to the first semiconductor die thereof. The assembly may also include a carrier substrate configured to have the first semiconductor die connected thereto in a flip-chip fashion.

The first semiconductor die includes bond pads arranged in an array over an active surface thereof. While some of the bond pads of the first semiconductor die are arranged on the active surface thereof so as to correspond to a footprint of bond pads of each second semiconductor die, others of the bond pads of the first semiconductor die are positioned so as to be exposed laterally beyond outer peripheries of one or more second semiconductor dice upon assembly thereof with the first semiconductor die. Each of the bond pads of the first semiconductor die that corresponds to a bond pad of a second semiconductor die may be recessed relative to the active surface so as to facilitate alignment and electrical connection with conductive structures protruding from the bond pads of the second semiconductor die. Each of the other, outer bond pads of the first semiconductor die, which may also be recessed relative to the active surface, may have protruding therefrom a conductive structure. Exemplary conductive structures include, but are not limited to, balls, bumps, columns, and pillars of conductive material, such as a solder, another metal or metal alloy, a conductive epoxy, a conductor-filled epoxy, or a z-axis conductive elastomer. These conductive structures facilitate electrical connection of an assembly including the first semiconductor die to a carrier for such an assembly. The first semiconductor die may be a microprocessor die or a die of any other known semiconductor device type.

Each second semiconductor die includes an active surface with a plurality of bond pads thereon. The bond pads of each second semiconductor die may be arranged on the active surface thereof in any manner known in the art, but are preferably disposed across the surface of each second semiconductor die in an array. The bond pads of each second semiconductor die are positioned so as to align with corresponding bond pads of the first semiconductor die upon orienting the second semiconductor die with the active surface thereof facing the active surface of the first semiconductor die. The bond pads of each second semiconductor die may be recessed relative to the active surface thereof so as to at least partially receive and align conductive structures with the bond pads. Each bond pad of each second semiconductor die may have a conductive structure secured thereto and protruding therefrom so as to facilitate electrical communication between first and second semiconductor dice upon assembly and electrical connection thereof. Semiconductor devices that may be used as a second semiconductor die include, without limitation, dynamic random access memories (DRAMs), static random access memories (SRAMs), other types of memory devices, ancillary or logic devices, and other known types of semiconductor devices.

The assembly may also include an alignment structure on the active surface of the first semiconductor die. The alignment structure preferably protrudes from the active surface of the first semiconductor die and includes at least one member configured to guide at least two adjoined peripheral edges of a second semiconductor die so as to facilitate the alignment of bond pads of the second semiconductor die with corresponding bond pads of the first semiconductor die upon orientation of the first and second semiconductor dice with the active surfaces thereof facing each other. The alignment structure thereby facilitates the formation of short, reliable electrical connections between corresponding bond pads of the first and second semiconductor dice. Each member of the alignment structure is preferably formed from an electrically insulative material and may be fabricated by known processes, such as by use of a photoresist, other photoimageable polymers, stereolithographic techniques, or by forming and patterning a layer of material on the active surface of the first semiconductor die. One or more alignment structures may also, or in the alternative, be disposed on a surface of a carrier, such as a carrier substrate, to facilitate the alignment of outer bond pads of the first semiconductor die with contact pads on the surface of the carrier upon orientation of the first semiconductor die with the active surface thereof facing the surface of the carrier.

The contact pads of the carrier are arranged on a surface thereof so as to correspond with a footprint of other, outer bond pads of the first semiconductor die that are to be located laterally beyond an outer periphery of a second semiconductor die upon assembly of the second semiconductor die with the first semiconductor die. Accordingly, the contact pads of the carrier are so located as to facilitate the flip-chip type connection of the first semiconductor die to the carrier. The carrier may also include, formed in the surface thereof, at least one recess configured and located to at least partially receive a corresponding second semiconductor die.

The first semiconductor die and each second semiconductor die to be electrically connected therewith may be assembled by orienting each second semiconductor die with the bond pads thereof in alignment with corresponding bond pads of the first semiconductor die. In such orienting, the active surfaces of the first and second semiconductor dice are facing one another. Bumps or other conductive structures on bond pads of one of the first and second semiconductor dice may be received by recesses of the other of the first and second semiconductor dice to facilitate alignment and electrical connection of the corresponding bond pads of the first and second semiconductor dice. Alternatively, or in addition, the orientation of each second semiconductor die relative to the first semiconductor die may be effected by way of an alignment structure protruding from the active surface of the first semiconductor die. Once each second semiconductor die has been properly oriented relative to the first semiconductor die, corresponding bond pads of the first and second semiconductor dice may be electrically connected by way of forming flip-chip type connections utilizing the conductive structures.

The assembly of semiconductor dice flip-chip bonded to one another may then be assembled with a carrier by orienting the active surface of the first semiconductor die over the surface of the carrier, with the outer bond pads of the first semiconductor die and the corresponding contact pads of the carrier in substantial alignment. Each recess formed in the surface of the carrier may also receive the corresponding second semiconductor die during orientation of the first semiconductor die over the carrier. Again, orientation of the first semiconductor die over the carrier may be facilitated by alignment structures protruding from the surface of the carrier. Once the first semiconductor die has been properly oriented over the carrier, the outer bond pads of the first semiconductor die and the corresponding contact pads of the carrier may be electrically connected to one another by way of known flip-chip type connections.

Alternatively, the first semiconductor die, at least one second semiconductor die, and the carrier substrate may be assembled by disposing each second semiconductor die in a corresponding recess of the carrier substrate and orienting the first semiconductor die over each second semiconductor die and the carrier substrate so as to align the bond pads thereof with corresponding bond pads of each second semiconductor die and with corresponding contact pads of the carrier. Electrical connections between bond pads of the first semiconductor die and the corresponding bond pads of each second semiconductor die may be formed substantially simultaneously with the electrical connections between the outer bond pads of the first semiconductor die and the corresponding contact pads of the carrier.

Once the semiconductor dice and the carrier have been assembled, at least the electrical connections between the first semiconductor die and each second semiconductor die connected thereto, as well as the connections between the first semiconductor die and the carrier, may be protected with an encapsulant material. For example, an underfill material may be introduced between the first semiconductor die and the carrier. As another example, known encapsulation techniques, such as transfer molding or the use of glob-top encapsulant materials, may be used to substantially cover and encapsulate the first and second semiconductor dice.

Other features and advantages of the present invention will become apparent to those of skill in the art through consideration of the ensuing description, the accompanying drawings, and the appended claims.

DETAILED DESCRIPTION OF THE INVENTION

Figure 1:
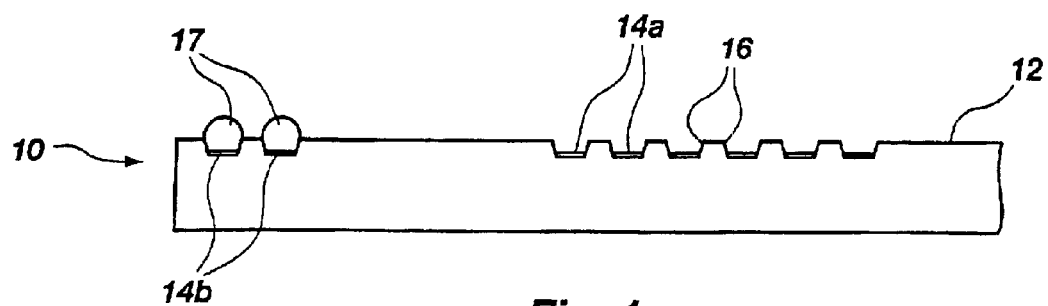
FIG. 1 is a cross-sectional representation of a first semiconductor die that may be used in assemblies and packages incorporating teachings of the present invention.
Figure 4:
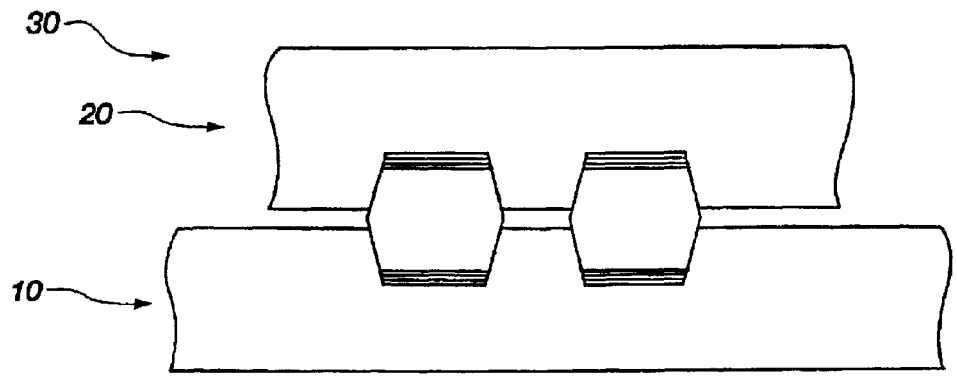
FIG. 4 is a cross-sectional representation of the assembly shown in FIG. 3 with corresponding bond pads of the first and second semiconductor dice being electrically connected to each other.

With reference to FIG. 1, a first semiconductor die 10 that is useful in an assembly 30 (see FIG. 4) incorporating teachings of the present invention is illustrated. First semiconductor die 10 includes an active surface 12 to which bond pads 14a and 14b (collectively referred to herein as bond pads 14) are exposed. As illustrated, bond pads 14 are recessed relative to active surface 12 and are each laterally surrounded by an upwardly extending alignment wall 16. Alignment wall 16 is preferably configured to receive a conductive structure, such as a ball, bump, column, or pillar of conductive material, such as a metal, a metal alloy, a conductive epoxy, a conductor-filled epoxy, or a z-axis conductive elastomer. While alignment walls 16 are depicted as being substantially flat and extending at an angle relative to a plane of first semiconductor die 10, shaped (i.e., curved or stepped) or textured alignment walls, as well as vertically extending alignment walls, are also within the scope of the present invention. Alternatively, bond pads 14 may be substantially flush with or protrude somewhat from active surface 12 of first semiconductor die 10.

Outer bond pads 14b of first semiconductor die 10 may have conductive structures 17 secured thereto and protruding therefrom. Conductive structures 17 facilitate communication between first semiconductor die 10 and a carrier to which first semiconductor die 10 or an assembly including first semiconductor die 10 is electrically connected.

Figure 2:
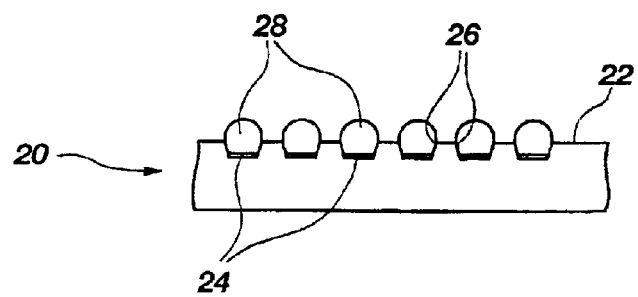
FIG. 2 is a cross-sectional representation of a second semiconductor die useful in assemblies and packages incorporating teachings of the present invention.

Referring now to FIG. 2, a second semiconductor die 20 that may be used in assembly 30 (see FIG. 4) is illustrated. Second semiconductor die 20 includes bond pads 24 arranged on an active surface 22 thereof. Bond pads 24 are positioned upon active surface 22 so as to align with corresponding bond pads 14a of first semiconductor die 10 upon orientation of second semiconductor die 20 over first semiconductor die 10, with active surface 22 facing active surface 12. Bond pads 24 of second semiconductor die 20 may be recessed relative to active surface 22 similarly to bond pads 14 of first semiconductor die 10. Accordingly, bond pads 24 of second semiconductor die 20 may each be laterally surrounded by a generally upwardly extending alignment wall 26, similar to alignment walls 16 of first semiconductor die 10. As shown in FIG. 2, each bond pad 24 of second semiconductor die 20 has a conductive structure 28 secured thereto. The illustrated conductive structures 28 are solder bumps. Other known types of conductive structures 28 are also within the scope of the present invention, including, without limitation, balls, bumps, columns, or pillars of conductive materials such as metals, metal alloys, conductive epoxies, conductor-filled epoxies, or z-axis conductive elastomers. Alternatively, conductive structures 28 may be secured to corresponding bond pads 14a of first semiconductor die 10.

Figure 3:
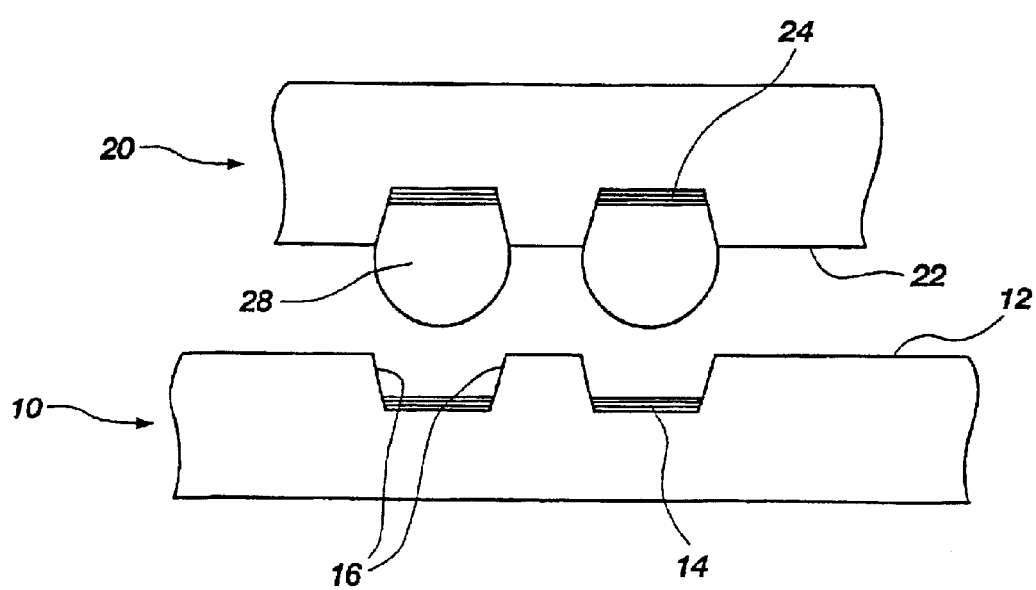
FIG. 3 is a cross-sectional representation of an assembly including the first semiconductor die shown in FIG. 1 and the second semiconductor die shown in FIG. 2 prior to the formation of electrical connections between the corresponding bond pads of the first and second semiconductor dice.

As illustrated in FIG. 3, a second semiconductor die 20 is oriented over first semiconductor die 10 with active surface 22 of second semiconductor die 20 facing active surface 12 of first semiconductor die 10. As bond pads 24 of second semiconductor die 20 are aligned with corresponding bond pads 14 of first semiconductor die 10, these corresponding bond pads 24 and 14 may be electrically connected to one another. Such alignment may be facilitated as alignment walls 16 of first semiconductor die 10 receive conductive structures 28 protruding from second semiconductor die 20. Conductive structures 28 may be electrically connected to corresponding bond pads 14 of first semiconductor die 10 as known in the art, such as by reflowing the conductive material thereof, to provide an electrically connected assembly 30 of first semiconductor die 10 and at least one second semiconductor die 20, such as that depicted in FIG. 4.

As corresponding bond pads 14 and 24 are electrically connected to one another by way of conductive structures 28, the physical lengths of electrical circuits including conductive structures 28 are much shorter than the physical lengths of circuits including wire bonds or conductive traces of carrier substrates, as have been employed in conventional multi-chip modules. Accordingly, first semiconductor die 10 may communicate with connected semiconductor dice, such as second semiconductor die 20, at much faster rates than are possible with conventional multi-chip modules.

Figure 5:
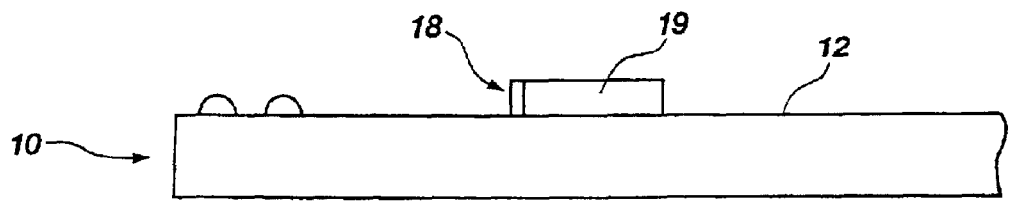
FIG. 5 is a side view of a first semiconductor die, such as that shown in FIG. 1, with an alignment structure protruding from an active surface thereof.

As shown in FIG. 5, first semiconductor die 10 may have an alignment structure 18 secured to active surface 12 thereof. Alignment structure 18 is preferably configured to guide at least two adjoined peripheral edges of another semiconductor die during orientation thereof upon active surface 12 of first semiconductor die 10.

Figure 6:
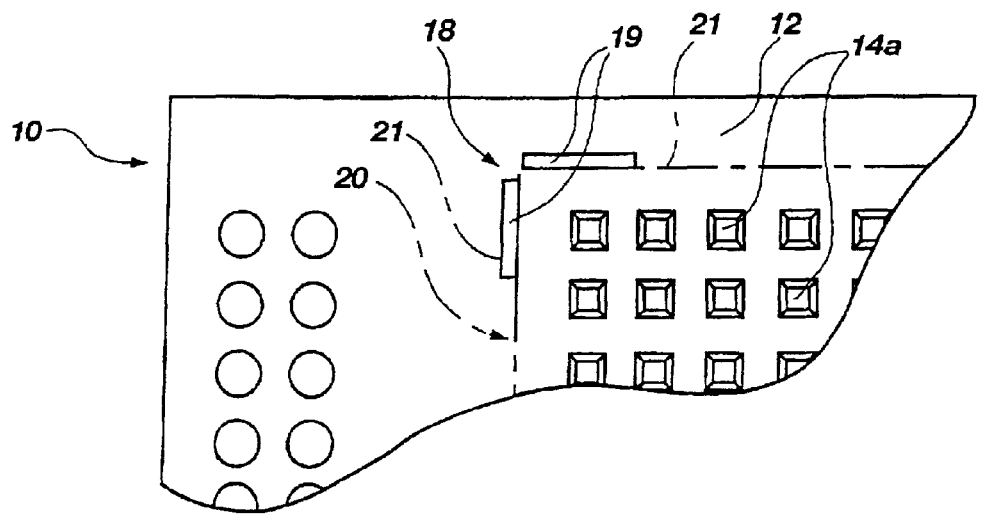
FIG. 6 is a top view of the first semiconductor die and a variation of an alignment structure on an active surface of the first semiconductor die, showing use of the alignment structure to align a second semiconductor die, depicted in phantom, with the first semiconductor die.

FIG. 6 illustrates the use of alignment structure 18 to properly align bond pads 24 of a second semiconductor die 20 (FIG. 2) relative to corresponding bond pads 14a of first semiconductor die 10 upon orientation of second semiconductor die 20 over first semiconductor die 10 with active surface 22 facing active surface 12. As shown in FIG. 6, alignment structure 18 includes two members 19. Alignment structures 18, however, with other numbers or configurations of members 19 that are configured to guide two or more adjoining peripheral edges 21 of second semiconductor die 20 are also within the scope of the present invention.

Each member 19 of alignment structure 18 may be fabricated by known processes. For example, members 19 of alignment structure 18 may be fabricated directly upon active surface 12 of first semiconductor die 10 by forming a material layer, such as a layer of glass, silicon dioxide, or silicon nitride by known processes, on active surface 12 and patterning the material layer, also by known processes. As another example, a photoimageable material, such as a photoresist or a polyimide, may be disposed on active surface 12 of first semiconductor die 10 and patterned by known photoimaging processes. In another example of the fabrication of alignment structure 18, members 19 thereof may be formed by known stereolithography techniques, such as that disclosed in U.S. patent application Ser. No. 09/259,142, filed on Feb. 26, 1999, and assigned to the assignee of the invention disclosed and claimed herein, the disclosure of which is hereby incorporated by this reference in its entirety. When stereolithography is employed to fabricate members 19 of alignment structure 18, one or more layers of substantially unconsolidated material, such as a photoimageable polymer, or "photopolymer," may be formed and at least partially selectively consolidated. If member 19 includes a plurality of layers, the layers are at least partially superimposed over one another, contiguous with one another, and mutually adhered to each other. Of course, stereolithography may be used to fabricate alignment structures 18 directly on active surface 12 or separately from first semiconductor die 10, in which case each member 19 of alignment structure 18 may subsequently be secured to active surface 12 as known in the art, such as by use of an appropriate adhesive material.

FIGS. 7–10 illustrate exemplary packages that include an assembly 30 of a first semiconductor die 10 and a second semiconductor die 20.

Figure 7:
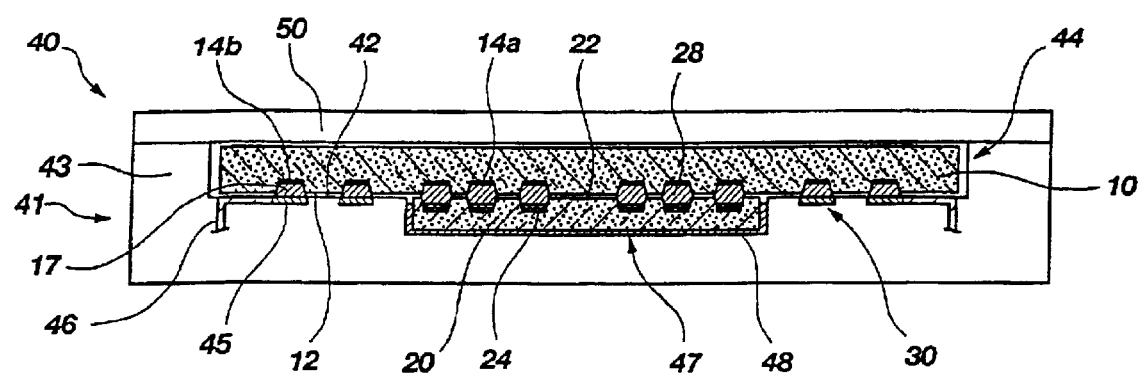
FIG. 7 is a cross-sectional representation of a package including the assembly shown in FIG. 4, a package body to which the assembly is electrically connected, and a package lid.

As illustrated in FIG. 7, one embodiment of a package 40 includes assembly 30, a package body 41, which is also referred to herein as a carrier substrate, configured to receive assembly 30 and to be electrically connected thereto, and a package lid 50 configured to be assembled with package body 41 so as to enclose assembly 30 within package 40. As illustrated, package body 41 includes a recessed surface 42 laterally bounded by upwardly extending peripheral walls 43. Peripheral walls 43 define a receptacle 44 configured to receive assembly 30. Surface 42 carries contact pads 45 that are arranged thereon so as to align with corresponding outer bond pads 14b of first semiconductor die 10 upon introduction of assembly 30 into receptacle 44 with active surface 12 of first semiconductor die 10 facing surface 42 of package body 41. Contact pads 45 are electrically connected to conductive traces 46 that are carried by package body 41 and, in turn, electrically connected to terminals or other connective elements (not shown) that facilitate communication between semiconductor dice 10, 20 of package 40 and external components (not shown). As an alternative to the embodiment of first semiconductor die 10 depicted in FIG. 1, conductive structures 17 may be secured to corresponding contact pads 45 of package body 41, rather than to outer bond pads 14b of first semiconductor die 10.

As shown, package body 41 also includes a die receptacle 47 recessed in surface 42. Die receptacle 47 is located and configured to at least partially receive a second semiconductor die 20 of assembly 30. Each die receptacle 47 may include therein a quantity of thermal grease 48 of a known type to facilitate the transfer of heat away from second semiconductor die 20 during operation thereof. Thermal grease 48 may also be used to secure second semiconductor die 20 or assembly 30 to a carrier, such as package body 41, prior to the bonding of outer bond pads 14b to their corresponding contact pads 45 with conductive structures 17.

If the depth of die receptacle 47 is substantially equal to the thickness of second semiconductor die 20 (not including the distance conductive structures 28 protrude from active surface 22 thereof), conductive structures 28 may protrude from active surface 22 of second semiconductor die 20 substantially the same distance that conductive structures 17 protrude from active surface 12 of first semiconductor die 10. Of course, the distance that conductive structures 17 protrude from active surface 12 of first semiconductor die 10 is preferably sufficient to permit conductive structures 17 to contact corresponding contact pads 45 upon orientation of first semiconductor die 10 invertedly over package body 41 or another carrier.

Following orientation of assembly 30 within receptacle 44 and relative to package body 41, assembly 30 may be electrically connected to package body 41 by reflowing conductive structures 17 protruding from outer bond pads 14b to secure conductive structures to contact pads 45 corresponding to outer bond pads 14b, or as otherwise known in the art.

Once assembly 30 has been disposed within receptacle 44 and electrically connected to package body 41, lid 50 may be disposed over receptacle 44 so as to enclose assembly 30 within package 40. Lid 50 may be secured to package body 41 as known in the art, such as by use of adhesives or mechanically.

An alternative method for electrically connecting assembly 30 to package body 41 includes orienting a second semiconductor die 20 in each die receptacle 47 of package body 41 with active surface 22 facing into receptacle 44. A first semiconductor die 10 is invertedly oriented within receptacle 44 with active surface 12 thereof facing surface 42 of package body 41 and active surface 22 of second semiconductor die 20. During such orientation, bond pads 24 and corresponding bond pads 14a, as well as outer bond pads 14b and corresponding contact pads of package body 41 are aligned. Conductive structures 17 and 28 may then be connected between bond pads 24 and corresponding bond pads 14a and between outer bond pads 14b and corresponding contact pads 45 as known in the art, such as by reflowing the conductive materials of conductive structures 17 and 28. In this manner, electrical connections between first and second semiconductor dice 10 and 20, as well as between assembly 30 and package body 41, may be substantially simultaneously formed.

Figure 8:
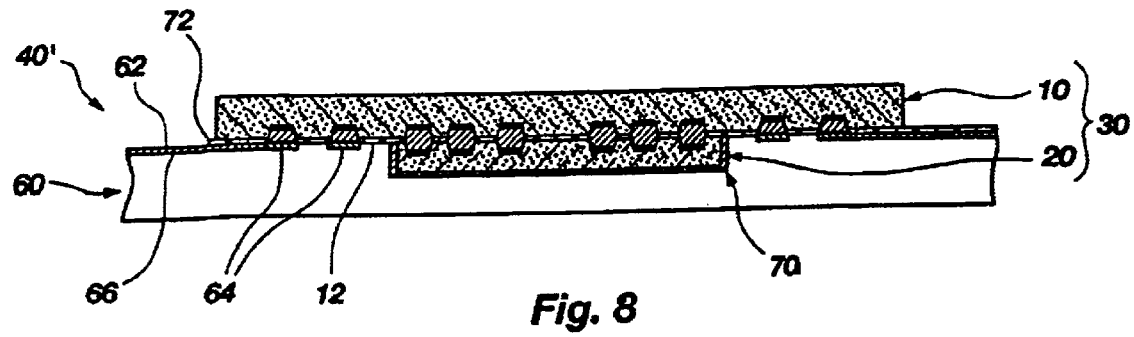
FIG. 8 is a cross-sectional representation of another embodiment of a package incorporating teachings of the present invention and including the assembly depicted in FIG. 4, a carrier substrate to which the assembly is electrically connected, and an underfill material between at least a portion of the first semiconductor die and the adjacent portion of the carrier substrate.

Referring now to FIG. 8, another embodiment of a package 40' incorporating teachings of the present invention is illustrated. Package 40' includes a substantially planar carrier substrate 60. Carrier substrate 60 includes a surface 62 upon which contact pads 64 are carried. Conductive traces 66 that communicate with corresponding contact pads 64 are also carried by carrier substrate 60 and lead to external conductive elements (not shown) to facilitate communication between an assembly 30 electrically connected to carrier substrate 60 and external components (not shown). Carrier substrate 60 may also include at least one receptacle 70 recessed in surface 62. Each receptacle 70 is preferably located and configured so as to at least partially receive a second semiconductor die 20 of an assembly 30 upon orientation of assembly 30 over carrier substrate 60 with active surface 12 of first semiconductor die 10 facing surface 62 of carrier substrate 60. Assembly 30 may be electrically connected and secured to carrier substrate 60 by known processes, such as those disclosed with reference to the connection of assembly 30 to package body 41 illustrated in FIG. 7. Package 40' also includes a quantity of underfill material 72 of a known type between active surface 12 of first semiconductor die 10 and surface 62 of carrier substrate 60.

Figure 9:
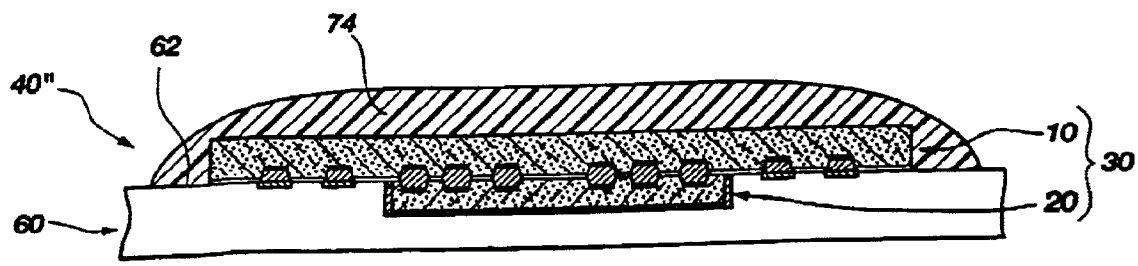
FIG. 9 is a cross-sectional representation of another embodiment of a package according to the present invention, including the assembly depicted in FIG. 4, a carrier substrate to which the assembly is electrically connected, and a glob-top type encapsulant disposed over the first semiconductor die.

FIG. 9 illustrates another embodiment of package 40'', which includes a substantially planar carrier substrate 60 with an assembly 30 of a first semiconductor die 10 and second semiconductor die 20 electrically connected and secured thereto. Package 40'' also includes a quantity of encapsulant material 74 disposed over first semiconductor die 10 and in contact with surface 62 of carrier substrate 60 so as to encapsulate and seal assembly 30. As illustrated, encapsulant material 74 is a conventional "glob-top" type encapsulant, such as silicone or an epoxy.

Figure 10:
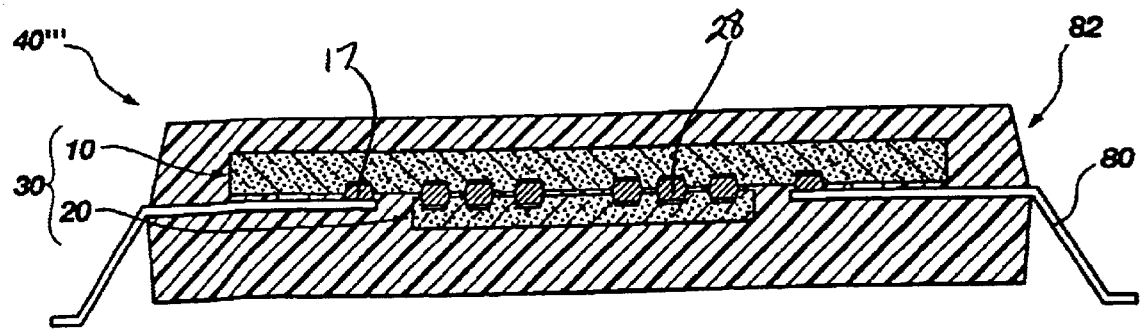
FIG. 10 is a cross-sectional representation of another embodiment of a package of the present invention, which includes the assembly depicted in FIG. 4, leads to which the assembly is electrically connected, and a molded package covering the assembly.

Yet another embodiment of a package 40''' according to the present invention is illustrated in FIG. 10. Package 40''' includes assembly 30 electrically connected to a carrier comprising leads 80, such as in the illustrated leads-over-chip (LOC) arrangement. Package 40''' includes a molded encapsulant 82 substantially covering and encapsulating assembly 30. Molded encapsulant 82 may be fabricated from known materials, such as thermoset resins (including particle-filled resins), and by known techniques, such as transfer molding processes. Thus, conductive structures 17, 28 are preferably formed from a conductive material that will survive the transfer molding process, such as a conductive epoxy or a conductor-filled epoxy.

Figure 11:
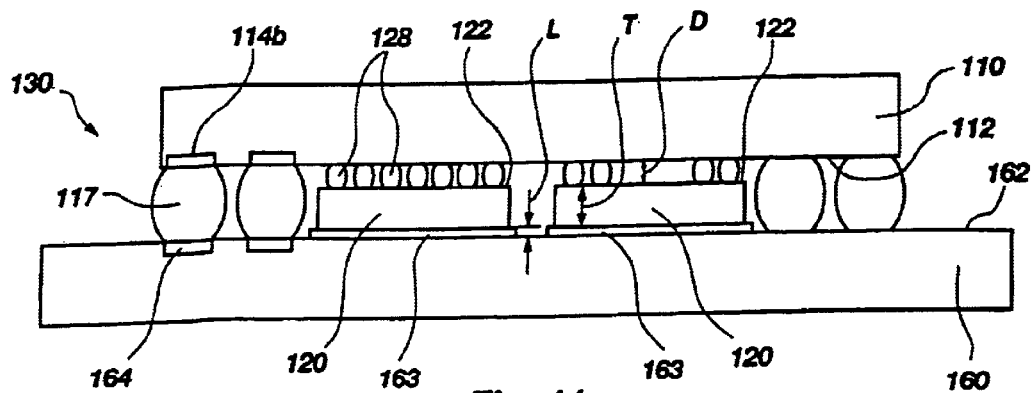
FIG. 11 is a cross-sectional representation of an assembly including a first semiconductor die with two second semiconductor dice flip-chip connected thereto, the first semiconductor die being flip-chip connected to a carrier substrate with conductive structures that each include a single member.
Figure 12:
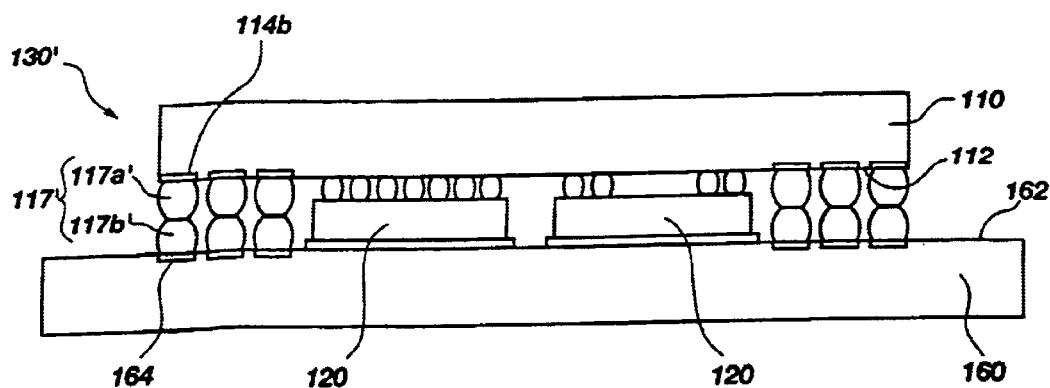
FIG. 12 is a cross-sectional representation of an assembly including a first semiconductor die with two second semiconductor dice flip-chip connected thereto, the first semiconductor die being flip-chip connected to a carrier substrate with conductive structures that each include two members.
Figure 13:
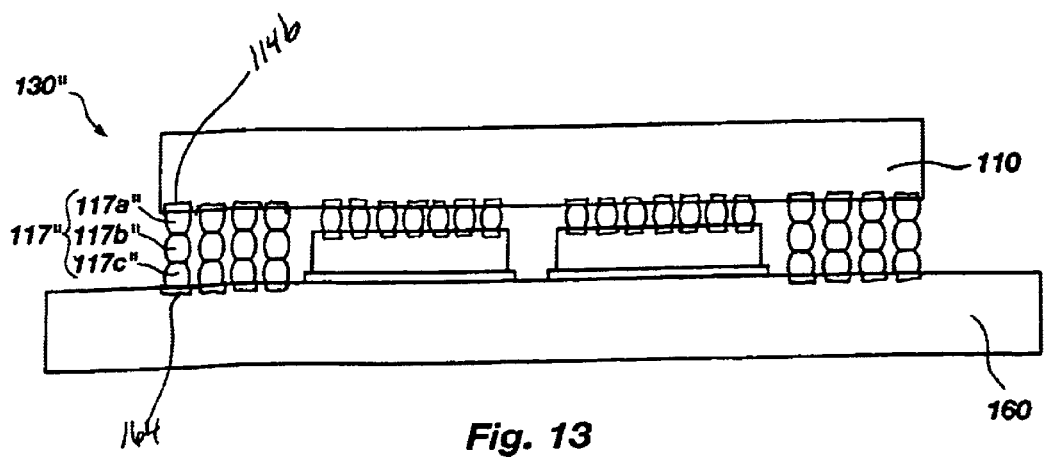
FIG. 13 is a cross-sectional representation of an assembly including a first semiconductor die with two second semiconductor dice flip-chip connected thereto, the first semiconductor die being flip-chip connected to a carrier substrate with conductive structures that each include three members.

FIGS. 11–13 depict alternative types of conductive structures that may be used in accordance with teachings of the present invention.

FIG. 11 illustrates an assembly 130 that includes one first semiconductor die 110 and two second semiconductor dice 120 flip-chip connected thereto by way of conductive structures 128, such as solder balls. Assembly 130 also includes a carrier substrate 160 upon which second semiconductor dice 120 rest and to which first semiconductor die 110 is electrically connected.

As illustrated, each second semiconductor die 120 rests upon a layer of thermal grease 163 of thickness L disposed on a surface 162 of carrier substrate 160. Each second semiconductor die 120 has a thickness T. Each conductive structure 128 extends a distance D between a plane of active surface 122 of second semiconductor die 120 and a plane of active surface 112 of first semiconductor die 110. Thus, active surface 112 of first semiconductor die 110 is separated from surface 162 of carrier substrate 160 by a distance of about L+T+D. Accordingly, in order to connect outer bond pads 114b of first semiconductor die 110 and corresponding contact pads 164 of carrier substrate 160, conductive structures 117 extending between corresponding outer bond pads 114b and contact pads 164 preferably have a height of about L+T+D.

A variation of an assembly 130' incorporating teachings of the present invention, shown in FIG. 12, includes the same elements as assembly 130, shown in FIG. 11, except for conductive structures 117. Rather, assembly 130' includes conductive structures 117' that include two members 117a' and 117b'. Member 117a' may be predisposed on outer bond pads 114b of first semiconductor die 110, while member 117b' may be predisposed on contact pads 164 of carrier substrate 160. The collective distances that members 117a' and 117b' protrude from active surface 112 and surface 162, respectively, are about equal to L+T+D. As first semiconductor die 110 is invertedly oriented and aligned over carrier substrate 160, members 117a' and 117b' of each conductive structure 117' are aligned and abut one another. Upon reflowing the conductive material of members 117a' and 117b' or otherwise securing corresponding members 117a' and 117b' to one another, integral conductive structures 117' that electrically connect corresponding outer bond pads 114b and contact pads 164 to each other are formed.

FIG. 13 depicts another variation of an assembly 130'' according to the present invention, which again includes the same elements as assembly 130, shown in FIG. 11, with the exception of conductive structures 117. In place of conductive structures 117 (FIG. 11), assembly 130'' includes conductive structures 117'' with more than two members, 117a'', 117b'', 117c'', etc.

Members 117a'' and 117c'' may comprise conductive structures that are predisposed on outer bond pads 114b and their corresponding contact pads 164, respectively. Members 117b'' may be formed by the process illustrated in FIGS. 14–17, or as otherwise known in the art.

Figure 14:
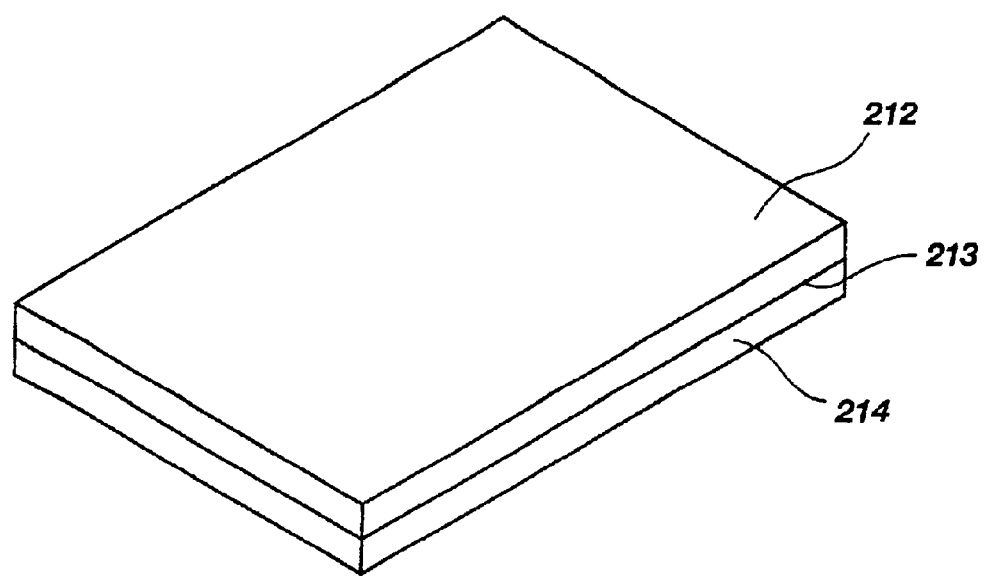
FIGS. 14–16 illustrate an exemplary method for fabricating a conductive mating structure to facilitate fabrication of the assembly shown in FIG. 13.

With reference to FIG. 14, a layer 214 of an electrically insulative support material, such as a polymer (e.g., a polyimide), is applied to a surface 213 of a substantially planar conductive layer 212 including a conductive material that will adhere to the conductive materials of members 117a" and 117c" (FIG. 13) during reflow of the conductive materials or otherwise, as known in the art. Polymeric layer 214 may be applied to conductive layer 212 by known processes, such as by spray-on techniques, spin-on techniques, or by other techniques for forming layers from polymeric materials. Conductive layer 212 may include a single layer of conductive material or more than one sublayer of conductive material.

Figure 15:
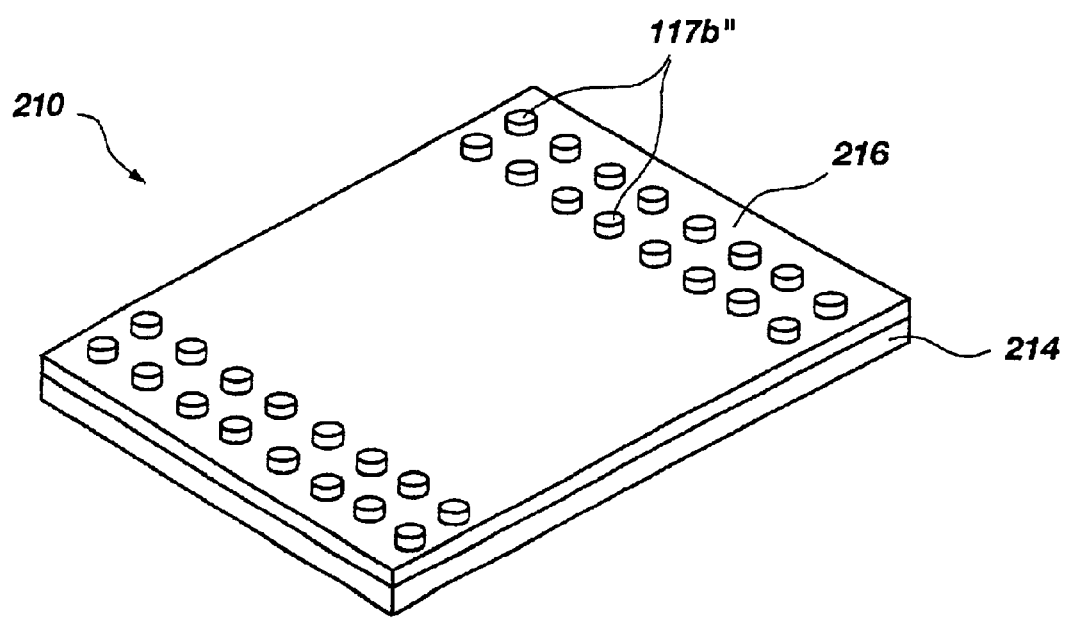

As shown in FIG. 15, conductive layer 212 is patterned to form members 117b" in desired locations on polymeric layer 214. Members 117b" are each preferably sized and positioned so as to facilitate alignment thereof with corresponding members 117a" and 117c" (FIG. 13). Conductive layer 212 may be patterned as known in the art, such as by use of photomask and etch processes. A layer 216 of an electrically insulative support material, such as a polymer (e.g., polyimide or polyester, such as the polyester film marketed by E. I. du Pont De Nemours and Company of Wilmington, Del. as MYLAR®) or other material that may be removed without damaging conductive structures 117" (FIG. 13) or any of the other components of assembly 130, may then be disposed laterally adjacent at least a portion of each member 117b" so as to support same upon removal of polymeric layer 214 therefrom. Members 117b" and layers 214 and 216 collectively form a conductive mating structure 210.

The structure 210 shown in FIG. 15 may also be fabricated by disposing preformed members 117b" on a layer 214 of an electrically nonconductive polymeric material, with members 117b" being secured to polymeric layer 214 by adhesion of the material thereof or with a separate adhesive material. Layer 216 may then be formed as described above.

Figure 16:
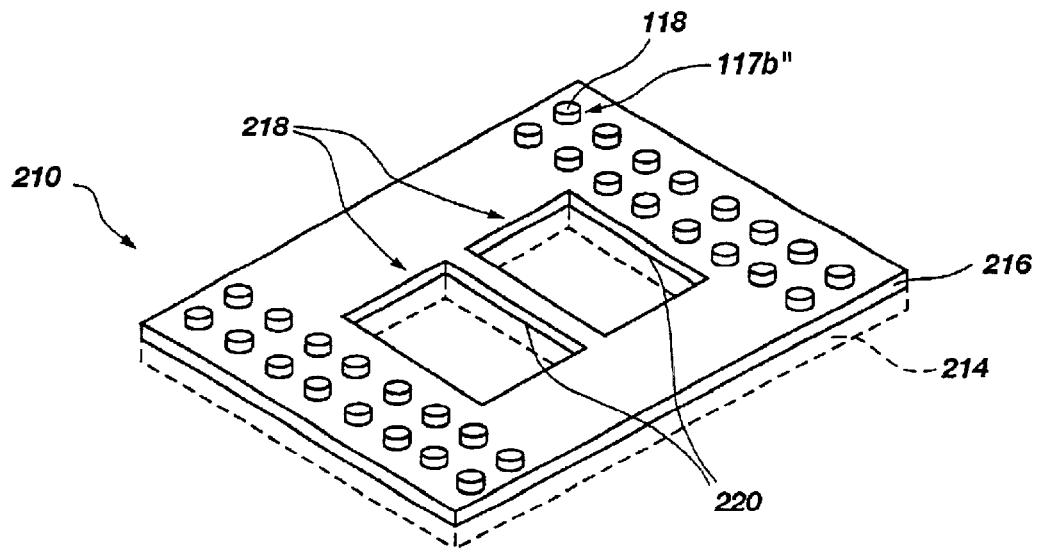

Turning now to FIG. 16, in preparation for electrically connecting first semiconductor die 110 to carrier substrate 160 (FIG. 13), polymeric layer 214 is at least partially removed so as to at least partially expose ends 118 of members 117b". Ends 218 of layers 214 and 216 that are alignable with second semiconductor dice 120 upon assembly are also removed so as to form through structure 210 slots 220 configured to receive second semiconductor dice 120 (FIG. 17).

Figure 17:
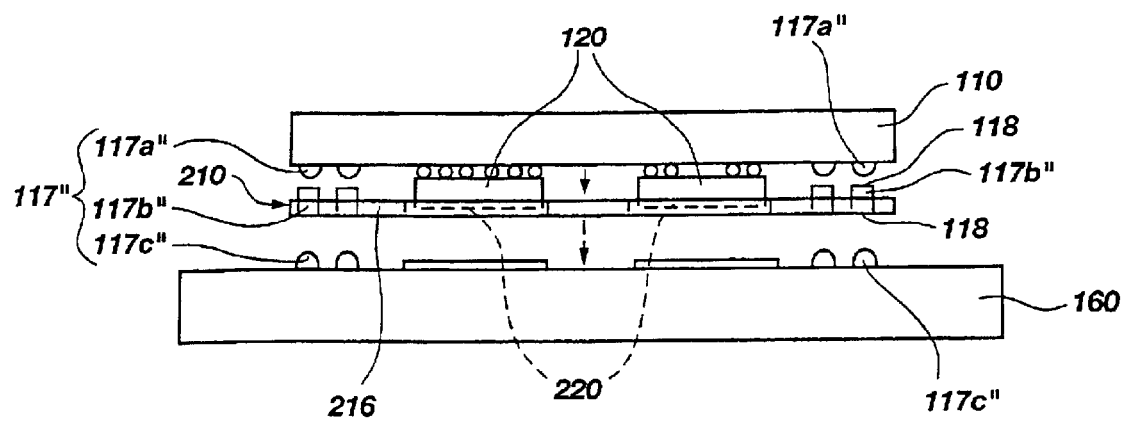
FIG. 17 is a cross-sectional representation of the use of the conductive mating structure depicted in FIG. 16 to form the assembly depicted in FIG. 13.

As illustrated in FIG. 17, carrier substrate 160 and the assembly of first and second semiconductor dice 110, 120 are assembled with structure 210 disposed therebetween. Upon such assembly, corresponding members 117a", 117b", and 117c" of each conductive structure 117" are in substantial alignment and second semiconductor dice 120 are received by corresponding slots 220. Corresponding members 117a", 117b", and 117c" may be secured so as to electrically communicate with one another by known processes, such as by reflowing the conductive material or materials thereof. The remainders of layers 214 (FIG. 16) and 216 may then be removed from assembly 130" or remain therein.

As the lengths of conductive structures 17 and 28 (see, e.g., FIGS. 4 and 7) and, thus, the distances between corresponding bond pads 14a and 24 and between outer bond pads 14b and their corresponding contact pads 45 are relatively short, the speed with which signals may be conveyed between these corresponding pairs of bond pads and contact pads is also increased. This proximity relative to lengthy connections between bond pads or between bond pads and contact pads in conventional multi-chip modules may beneficially facilitate the conveyance of signals of limited signal swing, with reduced signal rise and fall times, between connected semiconductor devices, further increasing the operation of an assembly 30 including multiple dice 10, 20. Accordingly, the number of repeaters in many of the circuits of semiconductor dice 10 and 20 may be reduced so as to limit the signal swing of these circuits.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method for interconnecting at least two semiconductor dice, comprising:

providing a first semiconductor die including a plurality of bond pads arranged in an array over an active surface thereof;

providing at least one second semiconductor die including a plurality of bond pads on an active surface thereof;

orienting the first semiconductor die and the at least one second semiconductor die with the active surfaces thereof facing each other by aligning a peripheral edge of the at least one second semiconductor die with an alignment structure disposed on the active surface of the first semiconductor die and interacting with the peripheral edge of the at least one second semiconductor die, the at least one second semiconductor die covering some bond pads of the plurality of bond pads, other bond pads of the plurality of bond pads remaining exposed beyond an outer periphery of the at least one second semiconductor die;

electrically connecting the some bond pads with corresponding bond pads of the plurality of bond pads of the first semiconductor die.

2. The method of claim 1, wherein providing the first semiconductor die comprises providing a logic device.

3. The method of claim 2, wherein providing the at least one second semiconductor die comprises providing at least one memory device.

4. The method of claim 1, wherein electrically connecting comprises providing conductive structures directly between each of the plurality of bond pads of the at least one second semiconductor die and the corresponding bond pads of the first semiconductor die.

5. The method of claim 4, wherein providing conductive structures comprises providing balls, bumps, columns, or pillars comprising conductive material.

6. The method of claim 4, wherein providing conductive structures comprises providing structures formed from a material comprising at least one of a metal, an alloy, a conductive epoxy, and a conductor-filled epoxy.

7. The method of claim 1, further comprising aligning the some bond pads of the at least one second semiconductor die with the corresponding bond pads of the first semiconductor die.

8. The method of claim 1, further comprising:
providing a carrier including a plurality of contacts;
orienting the first semiconductor die with the active surface thereof facing the carrier; and
electrically connecting the other bond pads of the at least one second semiconductor die to corresponding contacts of the carrier.

9. The method of claim 8, wherein providing the carrier comprises providing a carrier substrate with the plurality of contacts comprising contact pads located on a surface thereof.

10. The method of claim 9, wherein providing the carrier substrate comprises providing the carrier substrate with at least one recess formed in the surface.

11. The method of claim 10, wherein orienting includes at least partially disposing at least the at least one second semiconductor die in the at least one recess.

12. The method of claim 8, wherein providing the carrier comprises providing leads corresponding to each of the other bond pads of the at least one second semiconductor die.

13. The method of claim 8, wherein electrically connecting the other bond pads of the at least one second semiconductor die to the corresponding contacts of the carrier comprises disposing conductive elements between the other bond pads of the at least one second semiconductor die and the corresponding contacts of the carrier.

14. The method of claim 13, wherein disposing conductive elements comprises providing at least one of balls, bumps, columns, and pillars comprising conductive material between each of the other bond pads of the at least one second semiconductor die and the corresponding contacts of the carrier.

15. The method of claim 13, wherein disposing the conductive elements between the other bond pads of the at least one second semiconductor die and the corresponding contacts of the carrier comprises providing a quantity of a material comprising at least one of a metal, an alloy, a conductive epoxy, and a conductor-filled epoxy.

16. The method of claim 9, wherein providing the first semiconductor die comprises providing the first semiconductor die with a first member of a conductive element secured to each other bond pad thereof and wherein providing the carrier substrate comprises providing the carrier substrate with a second member of the conductive element secured to each corresponding contact pad thereof.

17. The method of claim 16, further comprising aligning at least the first and second members of the conductive element.

18. The method of claim 17, further comprising securing at least the first and second members of the conductive element directly to each other.

19. The method of claim 16, further comprising providing a conductive mating structure bearing a third member of the conductive element between the first semiconductor die and the carrier substrate.

20. The method of claim 19, further comprising aligning the first, second, and third members of the conductive element.

21. The method of claim 20, further comprising securing the first, second, and third members of the conductive element to one another.

22. A method for packaging a semiconductor device assembly, comprising:
providing a first semiconductor die including a plurality of bond pads arranged in an array over an active surface thereof;
providing at least one second semiconductor die including a plurality of bond pads arranged on an active surface thereof;
orienting the at least one second semiconductor die over the first semiconductor die with the active surface facing the active surface of the first semiconductor die by aligning a peripheral edge of the at least one second semiconductor die with an alignment structure disposed on the active surface of the first semiconductor die and interacting with the peripheral edge of the at least one second semiconductor die, the corresponding bond pads of the first and the at least one second semiconductor dice in alignment with one another;
electrically connecting at least some bond pads of the corresponding bond pads via laterally discrete, physically unconnected conductive structures;
providing a carrier with a plurality of contacts;
electrically connecting bond pads of the first semiconductor die exposed beyond the outer periphery of the at least one second semiconductor die to the corresponding contacts of the carrier; and
orienting the first semiconductor die over the carrier with the active surface facing the carrier, bond pads of the first semiconductor die exposed beyond an outer periphery of the at least one second semiconductor die in alignment with corresponding contacts of the carrier.

23. The method of claim 22, further comprising electrically connecting the plurality of bond pads of the at least one second semiconductor die to the corresponding plurality of bond pads of the first semiconductor die.

24. The method of claim 22, further comprising disposing a quantity of encapsulant material over at least the active surface of the first semiconductor die.

25. The method of claim 24, wherein disposing the quantity of encapsulant material comprises disposing underfill material between the first semiconductor die and the carrier.

26. The method of claim 24, wherein disposing the quantity of encapsulant material comprises substantially covering at least the first semiconductor die.

27. The method of claim 22, wherein providing the carrier comprises providing a carrier substrate with the plurality of contacts comprising contact pads located on a surface thereof.

28. The method of claim 27, wherein providing the carrier substrate comprises providing a carrier substrate with at least one recess formed in the surface.

29. The method of claim 28, wherein orienting the first semiconductor die comprises at least partially disposing the at least one second semiconductor die within the at least one recess.

30. The method of claim 22, wherein providing the carrier comprises providing a plurality of leads, each of the plurality of leads corresponding to the bond pads of the first semiconductor die exposed beyond the outer periphery of the at least one second semiconductor die.

31. The method of claim 27, wherein:
providing the first semiconductor die comprises providing the first semiconductor die with a first member of a conductive element secured to each bond pad thereof that is located beyond the outer periphery of the at least one second semiconductor die; and
providing the carrier substrate comprises providing the carrier substrate with a second member of the conductive element secured to each corresponding contact pad thereof.

32. The method of claim 31, further comprising aligning at least the first and second members of the conductive element.

33. The method of claim 32, further comprising securing at least the first and second members of the conductive element directly to each other.

34. The method of claim 31, further comprising providing a conductive mating structure bearing a third member of the conductive element between the first semiconductor die and the carrier substrate.

35. The method of claim 34, further comprising aligning the first, second, and third members of the conductive element.

36. The method of claim 35, further comprising securing the first, second, and third members of the conductive element to one another.

37. A method for packaging a semiconductor device assembly, comprising:
providing at least a first multi-chip module including:
a first semiconductor die with a plurality of bond pads arranged in an array over an active surface thereof; and
at least one second semiconductor die including a plurality of bond pads arranged on an active surface thereof, at least one peripheral edge of the at least one second semiconductor die aligned with an alignment structure disposed on the active surface of the first semiconductor die and interacting with the at least one peripheral edge of the at least one second semiconductor die, each of the plurality of bond pads of the at least one second semiconductor die in alignment with corresponding bond pads of the first semiconductor die, other bond pads of the first semiconductor die being exposed beyond an outer periphery of the at least one second semiconductor die, the active surfaces of the first semiconductor die and the at least one second semiconductor die facing one another, and the plurality of bond pads of the at least one second semiconductor die electrically connected to the corresponding bond pads of the first semiconductor die, other bond pads of the first semiconductor die exposed laterally beyond an outer periphery of the at least one second semiconductor die;
providing a carrier including contacts; and
orienting the at least the first multi-chip module with the active surface of the first semiconductor die facing the carrier and the other bond pads in alignment with corresponding contacts of the carrier.

38. The method of claim 37, further comprising:
providing at least a second multi-chip module including:
another first semiconductor die with a plurality of bond pads arranged in an array over an active surface thereof; and
an another at least one second semiconductor die including a plurality of bond pads arranged on an active surface thereof, each of the plurality of bond pads of the another at least one second semiconductor die in alignment with corresponding bond pads of the another first semiconductor die, the active surfaces of the another first semiconductor die and the another at least one second semiconductor die facing one another, and the bond pads of the another at least one second semiconductor die electrically connected to the corresponding bond pads of the another first semiconductor die, other bond pads of the another first semiconductor die exposed laterally beyond an outer periphery of the another at least one second semiconductor die; and
orienting the at least the second multi-chip module over the carrier with the active surface of the another first semiconductor die facing the carrier and the other bond pads in alignment with corresponding contacts of the carrier.

39. The method of claim 11, further comprising:
positioning a cover over the first semiconductor device and the at least one second semiconductor device.

40. The method of claim 1, wherein at least one of providing the first semiconductor die and providing the at least one second semiconductor die comprises providing at least one semiconductor die with at least some of the bond pads thereof being exposed through alignment recesses in an active surface thereof.

41. The method of claim 37, wherein:
providing the carrier comprises providing a carrier including a recess with a ledge therein and contacts exposed at the ledge; and
orienting comprises orienting the at least the first multi-chip module within the recess with the active surface of the first semiconductor die facing the carrier and the ledge.

42. The method of claim 41, further comprising: positioning a cover over the recess and the first and at least one second semiconductor dice therein.

* * * * *

UNITED STATES PATENT AND TRADEMARK OFFICE
CERTIFICATE OF CORRECTION

PATENT NO. : 6,984,544 B2 Page 1 of 1
APPLICATION NO. : 09/944487
DATED : January 10, 2006
INVENTOR(S) : Cloud et al.

It is certified that error appears in the above-identified patent and that said Letters Patent is hereby corrected as shown below:

On the title page, item (54), in "Title", in column 1, line 1, delete "DIE TO DIE" and insert-- DIE-TO-DIE --, therefor.

On the title page, item (56), under "Other Publications", in column 2, line 4, delete "Microeletronic" and insert -- Microelectronic --, therefor.

In column 1, line 1, delete "DIE TO DIE" and insert -- DIE-TO-DIE --, therefor.

Signed and Sealed this

Eighth Day of April, 2008

JON W. DUDAS
*Director of the United States Patent and Trademark Office*